(12) United States Patent
Hembree

(10) Patent No.: US 6,806,567 B2
(45) Date of Patent: Oct. 19, 2004

(54) CHIP ON BOARD WITH HEAT SINK ATTACHMENT AND ASSEMBLY

(75) Inventor: David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 171 days.

(21) Appl. No.: 09/834,297

(22) Filed: Apr. 12, 2001

(65) Prior Publication Data

US 2001/0015493 A1 Aug. 23, 2001

Related U.S. Application Data

(60) Continuation of application No. 09/510,894, filed on Feb. 23, 2000, now Pat. No. 6,229,204, which is a division of application No. 09/146,945, filed on Sep. 3, 1998, now Pat. No. 6,117,797.

(51) Int. Cl.[7] .................. H01L 23/495; H01L 23/22; H01L 23/48; H01L 23/10; H01L 23/34
(52) U.S. Cl. .................. 257/707; 257/675; 257/687; 257/688; 257/706; 257/708; 257/712; 257/713; 257/718; 257/719
(58) Field of Search .................. 257/712–713, 257/782–784, 780, 707, 719, 708, 706, 688, 687, 675; 361/709, 703, 706

(56) References Cited

U.S. PATENT DOCUMENTS

| 4,024,570 A | 5/1977 | Hartmann et al. |
| 4,059,467 A | 11/1977 | Mancke et al. |
| 4,059,708 A | 11/1977 | Heiss, Jr. et al. |
| 4,081,825 A | 3/1978 | Koopman et al. |
| 4,143,456 A | 3/1979 | Inoue |
| 4,264,917 A | 4/1981 | Ugon |
| 4,300,153 A | 11/1981 | Hayakawa et al. |
| 4,323,914 A | 4/1982 | Berndlmaier et al. |
| 4,358,552 A | 11/1982 | Shinohara et al. |
| 4,507,675 A | 3/1985 | Fujii et al. |
| 4,602,678 A | 7/1986 | Fick |
| 4,628,406 A | 12/1986 | Smith et al. |

(List continued on next page.)

FOREIGN PATENT DOCUMENTS

| EP | 522563 | * 9/1992 |
| JP | 52-77684 | 6/1977 |
| JP | 55-128835 | 10/1980 |

(List continued on next page.)

OTHER PUBLICATIONS

Crum, Susan, *Trends in Advanced Component Technologies*, Electronic Packaging & Production (Jan. 1998) pp. 48–53.
Lawing, Chris, *Vacuum Dispensing of Encapsulants for μBGA Manufacturing*, Electronic Packaging & Production (Feb. 1998), pp. 87–91.

(List continued on next page.)

*Primary Examiner*—David E. Graybill
*Assistant Examiner*—James M. Mitchell
(74) *Attorney, Agent, or Firm*—TraskBritt

(57) ABSTRACT

A process for forming a thermally enhanced Chip On Board semiconductor device with a heat sink is described. In one aspect, a thermally conducting filled gel elastomer material or a silicon elastomeric material or elastomeric material, if the material is to be removed, is applied to the die surface to which the heat sink is to be bonded. During the subsequent glob top application and curing steps, difficult-to-remove glob top material which otherwise may be misapplied to the die surface adheres to the upper surface of the elastomer material. The elastomer material is removed by peeling prior to adhesion bonding of the heat sink to the die. In another aspect, the thermally conducting filled gel elastomer material is applied between a die surface and the inside attachment surface of a cap-style heat sink to eliminate overpressure on the die/substrate interface.

4 Claims, 6 Drawing Sheets

U.S. PATENT DOCUMENTS

| | | |
|---|---|---|
| 4,642,671 A | 2/1987 | Rohsler et al. |
| 4,801,998 A | 1/1989 | Okuaki |
| 4,862,245 A | 8/1989 | Pashby et al. |
| 4,873,615 A | 10/1989 | Grabbe |
| 4,931,852 A | 6/1990 | Brown et al. |
| 4,942,140 A | 7/1990 | Ootsuki et al. |
| 4,961,107 A | 10/1990 | Geist et al. |
| 4,984,059 A | 1/1991 | Kubota et al. |
| 5,051,275 A | 9/1991 | Wong |
| 5,071,787 A | 12/1991 | Mori et al. |
| 5,081,067 A | 1/1992 | Shimizu et al. |
| 5,101,465 A | 3/1992 | Murphy |
| 5,108,955 A | 4/1992 | Ishida et al. |
| 5,120,665 A | 6/1992 | Tsukagoshi et al. |
| 5,144,747 A | 9/1992 | Eichelberger |
| 5,173,764 A | 12/1992 | Higgins, III |
| 5,175,613 A * | 12/1992 | Barker, III et al. ......... 257/713 |
| 5,182,173 A * | 1/1993 | Swei ......................... 428/391 |
| 5,184,208 A | 2/1993 | Sakuta et al. |
| 5,194,930 A | 3/1993 | Papathomas et al. |
| 5,201,866 A | 4/1993 | Mok |
| 5,218,759 A | 6/1993 | Juskey et al. |
| 5,227,663 A * | 7/1993 | Patil et al. ................... 257/718 |
| 5,233,220 A | 8/1993 | Lamson et al. |
| 5,239,200 A | 8/1993 | Messina et al. |
| 5,249,101 A * | 9/1993 | Frey et al. ................... 361/717 |
| 5,252,853 A | 10/1993 | Michii |
| 5,286,679 A | 2/1994 | Farnworth et al. |
| 5,289,346 A | 2/1994 | Carey et al. |
| 5,291,064 A | 3/1994 | Kurokawa |
| 5,304,842 A | 4/1994 | Farnworth et al. |
| 5,311,060 A | 5/1994 | Rostoker et al. |
| 5,344,795 A | 9/1994 | Hashemi et al. |
| 5,358,598 A | 10/1994 | Chiu |
| 5,358,904 A | 10/1994 | Murakami et al. |
| 5,358,906 A | 10/1994 | Lee |
| 5,371,044 A | 12/1994 | Yoshida et al. |
| 5,378,924 A | 1/1995 | Liang |
| 5,379,186 A | 1/1995 | Gold et al. |
| 5,379,187 A | 1/1995 | Lee et al. |
| 5,379,191 A | 1/1995 | Carey et al. |
| 5,385,869 A | 1/1995 | Liu et al. |
| 5,387,554 A | 2/1995 | Liang |
| 5,394,303 A | 2/1995 | Yamaji |
| 5,396,403 A | 3/1995 | Patel |
| 5,432,127 A | 7/1995 | Lamson et al. |
| 5,432,675 A | 7/1995 | Sorimachi et al. |
| 5,434,105 A | 7/1995 | Liou |
| 5,436,203 A | 7/1995 | Lin |
| 5,438,216 A | 8/1995 | Juskey et al. |
| 5,441,684 A | 8/1995 | Lee |
| 5,450,283 A | 9/1995 | Lin et al. |
| 5,455,200 A | 10/1995 | Bigler et al. |
| 5,455,457 A | 10/1995 | Kurokawa |
| 5,461,255 A | 10/1995 | Chan et al. |
| 5,468,995 A | 11/1995 | Higgins, III |
| 5,477,082 A | 12/1995 | Buckley, III et al. |
| 5,488,254 A | 1/1996 | Nishimura et al. |
| 5,489,538 A | 2/1996 | Rostoker et al. |
| 5,489,801 A | 2/1996 | Blish, II |
| 5,541,446 A | 7/1996 | Kierse |
| 5,552,635 A * | 9/1996 | Kim et al. ................... 257/706 |
| 5,579,573 A | 12/1996 | Baker et al. |
| 5,594,282 A | 1/1997 | Otsuki |
| 5,596,231 A | 1/1997 | Combs |
| 5,598,034 A | 1/1997 | Wakefield |
| 5,604,376 A | 2/1997 | Hamburgen et al. |
| 5,610,442 A * | 3/1997 | Schneider et al. .......... 257/787 |
| 5,641,997 A | 6/1997 | Ohta et al. |
| 5,652,461 A | 7/1997 | Ootsuki et al. |
| 5,656,857 A | 8/1997 | Kishita |
| 5,659,952 A | 8/1997 | Kovac et al. |
| 5,663,106 A | 9/1997 | Karavakis et al. |
| 5,672,548 A | 9/1997 | Culnane et al. |
| 5,681,757 A | 10/1997 | Hayes |
| 5,701,034 A | 12/1997 | Marrs |
| 5,705,851 A * | 1/1998 | Mostafazadeh ............. 257/675 |
| 5,891,753 A | 4/1999 | Akram |
| 5,898,571 A * | 4/1999 | Mertol ....................... 361/704 |
| 5,905,638 A * | 5/1999 | MacDonald, Jr. et al. .. 361/769 |
| 5,909,056 A | 6/1999 | Mertol |
| 5,931,222 A * | 8/1999 | Toy et al. ................... 165/80.3 |
| 5,969,947 A * | 10/1999 | Johnson et al. ............. 361/704 |
| 6,081,027 A * | 6/2000 | Akram ........................ 257/707 |
| 6,121,680 A * | 9/2000 | Chiu et al. ................... 257/714 |
| 6,190,945 B1 * | 2/2001 | Akram ........................ 438/122 |
| 6,232,152 B1 | 5/2001 | DiStefano et al. |
| 6,249,436 B1 * | 6/2001 | Bollesen ..................... 361/720 |
| 6,251,707 B1 | 6/2001 | Bernier et al. |
| 6,263,566 B1 * | 7/2001 | Hembree et al. ............. 29/874 |
| 6,432,511 B1 * | 8/2002 | Davis et al. ................. 428/156 |
| 6,534,859 B1 * | 3/2003 | Shim et al. ................. 257/706 |
| 2001/0015492 A1 * | 8/2001 | Akram et al. ............... 257/706 |
| 2002/0012762 A1 * | 1/2002 | Bunyan ..................... 428/40.2 |

FOREIGN PATENT DOCUMENTS

| | | |
|---|---|---|
| JP | 56-4241 | 1/1981 |
| JP | 60-94744 | 5/1985 |
| JP | 60-178651 | 9/1985 |
| JP | 62-109326 | 5/1987 |
| JP | 62-115834 | 5/1987 |
| JP | 62-261133 | 11/1987 |
| JP | 2-306639 | 12/1990 |
| JP | 4-157758 | 5/1992 |
| JP | 6-252299 * | 9/1994 |

OTHER PUBLICATIONS

Markstein, Howard W., *Cooling Techniques for Today's Electronics*, Electronic Packaging & Production (Nov. 1997), pp. 78–82.

Smith, Brenda, *Packaging to Beat the Heat*, Semiconductor International (Nov. 1997), pp. 73–76.

*Die Attach Products*, Johnson Matthey Electronics, Product Data (Jul. 1, 1994), 6 pages.

*Product Bulletin*, Dexter Electronic Materials Division (undated), 2 pages.

\* cited by examiner

CHIP ON BOARD WITH HEAT SINK ATTACHMENT AND ASSEMBLY

CROSS REFERENCE TO RELATED APPLICATIONS

This application is a continuation of application Ser. No. 09/510,894, filed Feb. 23, 2000, now U.S. Pat. No. 6,229,204 B1, issued May 8, 2001, which is a divisional of application Ser. No. 09/146,945, filed Sep. 3, 1998, now U.S. Pat. No. 6,117,797, issued Sep. 12, 2000.

BACKGROUND OF THE INVENTION

1. Field of the Invention:

This invention relates generally to integrated circuit packages and methods of package assembly. More particularly, the present invention pertains to the manufacture of Chip On Board devices with heat sinks for high power dissipation.

2. State of the Art:

Semiconductor devices are used in a wide variety of products, including computers, automobiles, integrated circuit cards, audio/video products, and a plethora of other electronic apparatus.

Modern electronic appliances such as computers have hundreds of integrated circuits (IC) and other electronic components, most of which are mounted on printed circuit boards (PCB). Heat is generated by such components. The heat generated by many ICs and other electronic components with simple circuits may often be dissipated without an additional heat sink. However, components requiring added heat sinks are becoming more numerous as the required speed, circuit complexity, and circuit density have increased.

In particular, as semiconductor devices have become more dense in terms of electrical power consumption per unit volume, heat generation has greatly increased, requiring package construction which dissipates the generated heat much more rapidly. As the state of the art progresses, the ability to adequately dissipate heat is often a severe constraint on the size, speed, and power consumption of an integrated circuit design.

The term "heat sink" is used herein in general reference to a passive heat transfer device, for example, an extruded aluminum plate with or without fins thereon. The plate is thermally coupled to an electronic component, e.g., semiconductor die, to absorb heat from the component and dissipate the heat by convection into the air. In this application, a heat sink will be distinguished from a "heat spreader," the latter pertaining to a member which channels heat from a semiconductor die to leads which exit the die package. However, a heat sink and a heat spreader may together be used to cool a device.

Integrated circuit devices are constructed by making, e.g., a (silicon or germanium) semiconductor die with internal and surface circuits including transistors, resistors, capacitors, etc. A single semiconductor die may contain thousands of such components and generate considerable heat. Electrical connection pads on an "active" surface of the semiconductor die are connected to the various die circuits. The integrated circuit device also includes electrical leads enabling the electrical connection pads of the semiconductor die to be connected to circuits on a PCB (or other substrate) of an appliance.

Dissipation of generated thermal energy is necessary for safe operation of an electronic appliance. An excessively high temperature of an IC may cause a circuit board fire and damage or destroy the appliance. High temperatures cause failure of the integrated circuits themselves. State of the art methods for absorbing and dissipating thermal energy from high speed Chip On Board (COB) semiconductor devices are inadequate for any or all of the following reasons: (a) insufficient heat transfer capability, (b) excessively large package size, especially the profile height, (c) complexity of manufacture, and/or (d) excessive cost.

Current methods of forming glob topped Chip On Board devices with heat sinks are shown in U.S. Pat. No. 5,552,635 of Kim et al., U.S. Pat. No. 5,477,082 of Buckley III et al., U.S. Pat. No. 5,468,995 of Higgins III, U.S. Pat. No. 5,610,442 of Schneider et al., and U.S. Pat. No. 5,659,952 of Kovac et al.

In U.S. Pat. No. 5,450,283 of Lin et al., a method for making a semiconductor device with an exposed die back side is described. The method includes providing a printed wiring board (PWB) substrate with conductive traces, on which a semiconductor die is flip mounted and connected to the conductive traces. An electrically nonconductive coupling material is placed between the die and substrate. A package body is formed around the perimeter of the die, covering a portion of the conductive traces and any portion of the coupling material extending beyond the die perimeter. The back side of the die is left exposed through the use of a thin layer of tape placed in the mold cavity prior to the transfer molding of the package body around the die to prevent the flow of molding material forming the package from flowing on the inactive back side of the die. If the thin layer of tape adheres to the die after removal of the semiconductor device from the mold cavity, the thin layer of tape is removed from the die of the semiconductor device.

A device made with multiple layers of encapsulant is shown in U.S. Pat. No. 5,379,186 of Gold et al.

SUMMARY OF THE INVENTION

In accordance with the invention, an improved method for fabricating a Chip On Board semiconductor device requiring enhanced heat dissipation is applicable to direct attachment of semiconductor devices, such as dynamic memory semiconductor dice, to substrates, such as circuit boards and the like, and to the formation of modules incorporating a substrate, such as a circuit board.

In one aspect of the invention, an elastomer is used to cover a portion of a semiconductor die prior to glob top application of the die to the circuit board. The elastomer is removed, e.g., by peeling, from the die surface and includes any glob top material which has inadvertently been applied to the elastomer. Thus, the portion of the semiconductor die remains free of contaminants. If desired, since a portion of the semiconductor die is free of contaminants, providing a good adhesion surface, a heat sink may be attached to such portion of the semiconductor die. The method is applicable to both wire-bonded dice and flip-chip die bonding to circuit boards. Alternatively, the elastomer may be retained on a portion of the semiconductor die after the molding or glob-topping of the die for the attachment of a heat sink thereto, if desired. The elastomer may be a highly thermally conductive elastomer to enhance the heat transfer from the semiconductor die to the surrounding environment. An example of a highly thermally conductive elastomer is a metal-filled elastomer or an elastomer filled with a highly thermally conductive material like metal.

The preferred elastomer is highly heat conductive, very compliant, has a relatively low adhesiveness and a high surface wetting property, all the type of properties that enhances heat transfer from the semiconductor die.

In another aspect of the invention, a heat conductive cap is formed over a semiconductor die and comprises a heat sink. A layer of the metal filled gel elastomer is placed between the non-active surface of a die and the cap. Compressing the die into the cap forms the desired adhesion to retain the die within the cap. The compliance of the elastomer enables the die and cap to be pressed together without overpressuring the die/circuit board interface. In addition, the high thermal conductivity of the elastomer enables devices having a very high heat output to be cooled to temperatures enabling reliable operation.

The method of the invention includes steps for forming direct die-to-circuit board connections for "heat sinked" dice as well as for forming "heat sinked" die modules which may be themselves connected to a substrate such as a circuit board.

These and other features and advantages will be more clearly understood from the following detailed description when taken in conjunction with the accompanying drawings. It is important to note that the illustrations are not necessarily drawn to scale, and that there may be other embodiments of the invention which are not specifically illustrated. Like elements of the various figures are designated by like numerals.

DETAILED DESCRIPTION OF THE INVENTION

Figure 1:
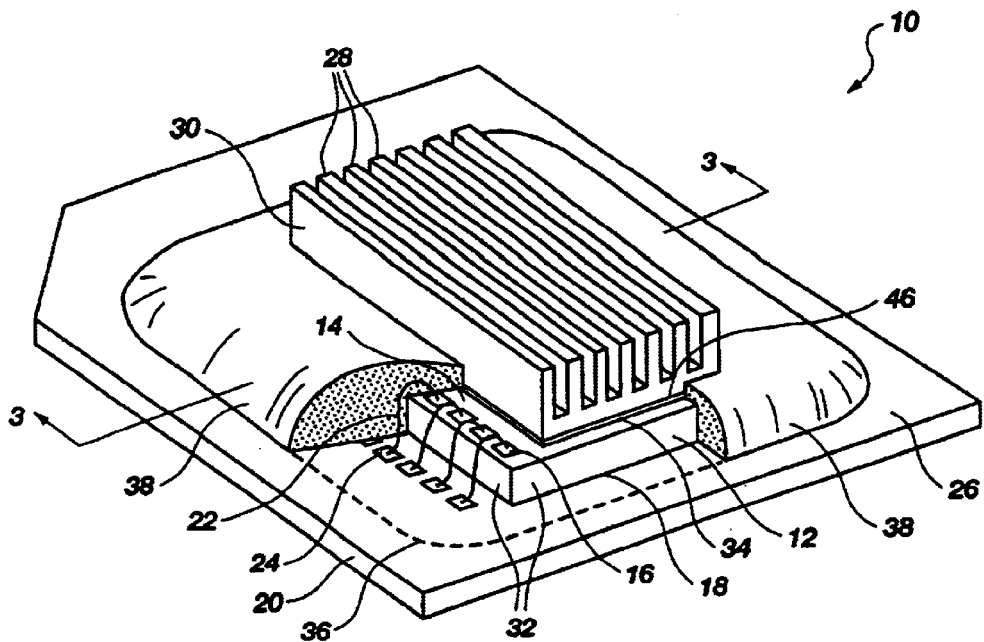
FIG. 1 is a perspective view of a wire-bonded Chip On Board (COB) semiconductor device of the invention.

As shown in drawing FIG. 1, a first semiconductor device 10 with a high heat generation rate is shown. The semiconductor device 10 includes a semiconductor die 12 having an active surface 14 with bond pads 16, as known in the art. The semiconductor die 12 has a back side 18 which is bonded to a substrate 20, shown here as a printed circuit board (PCB). The bond pads 16 are shown as conventionally arrayed near the edges 32 of the semiconductor die 12, and are wire-bonded with conductive, e.g., gold, wires 22 to corresponding electrical connection pads 24 on the substrate 20. Leads on the upper surface 26 and below the upper surface 26 of the substrate 20 are not shown.

As shown, a heat-conductive heat sink 30 with fins 28 is mounted on the upper, i.e., active surface 14 of the semiconductor die 12, between the rows of bond pads 16. The heat sink 30 has a relatively large exposed surface area, enabling a high transfer rate of thermal energy. An adhesive 34 having a high heat conductance is preferably used, but other adhesives may be alternatively used to bond the heat sink 30 to the semiconductor die 12, particularly because the adhesive 34 is applied in a very thin layer.

Also shown in drawing FIG. 1 is a "glob top" material 38 applied to encapsulate and seal the semiconductor die 12, wires 22, and surrounding portions 36 of the substrate 20. A major portion of the heat sink 30 is exposed to the ambient air for high heat transfer rates. If necessitated by very high heat generation, a fan (not shown) may be used in the appliance to further increase heat dissipation. The glob top material 38 may be any suitable glob top material, an encapsulant type material, etc.

In an alternative arrangement, the glob top material 38 may be applied to overcover a major portion or all of the heat sink 30. This results in decreased heat dissipation capability, however, but may be used where the thermal output of the device permits.

It is evident that more than one semiconductor device 10 may be attached to a single heat sink 30, and together sealed by application of glob top material 38.

The heat sink 30 is typically formed of a conductive metal such as aluminum, and has one attachment surface 46 which is attachable by adhesive 34 to the semiconductor die 12. The heat sink 30 may be of any design which provides the desired heat dissipation, is joinable to the die active surface 14 and sealable by a glob top material 38. For example, the heat sink 30 may either have fins 28 or be finless.

Turning now to drawing FIGS. 3A through 3G, the steps of fabricating semiconductor device 10 from a semiconductor die 12, lead wires 22 and a heat sink 30 are outlined in more detail.

Figure 3A:
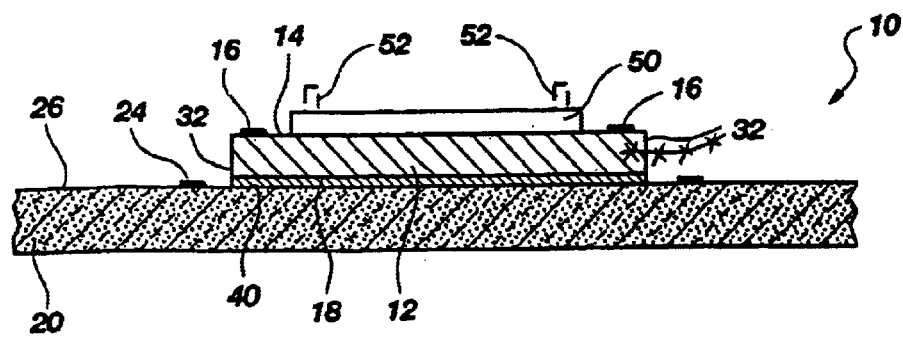
FIGS. 3A through 3G are cross-sectional views of a wire-bonded Chip On Board (COB) semiconductor device illustrating the steps of fabrication in accordance with the invention, as taken along line 3—3 of FIG. 1.

In drawing FIG. 3A, a semiconductor die 12 has an active surface 14 with bond pads 16 near opposing sides of the semiconductor die 12. The back side 18 of the semiconductor die 12 is first bonded to the upper surface 26 of the substrate 20 by a layer of adhesive 40. The substrate 20 may be a printed circuit board (PCB) or other materials such as a flex circuit or ceramic. A layer of a thermally conductive filled gel elastomer 50 may be either applied to the semiconductor die while in wafer form or subsequently applied to active surface 14 between the arrays of bond pads 16 of the semiconductor die 12 after singulation of the semiconductor die 12 from the wafer. The purpose of the gel elastomer 50 is to provide a protective mask over an area of the semiconductor die 12 to which the heat sink 30 (FIG. 3E) is to be bonded. Alternatively, when a second layer is used as a mask, the first layer may be retained on a portion of the semiconductor die 12 after the molding or glob-topping of the semiconductor die 12 for the attachment of a heat sink thereto, if desired (to be described in FIG. 3C). The gel elastomer 50 is applied as a gel or as a semi-solid or solid coupon. The gel elastomer 50, or a suitable silicon elastomeric material, etc. if the gel elastomer 50 is to be disposed after removal from the semiconductor die 12, or the use of a metal filled gel elastomer 50 if such is to remain on the semiconductor die 12, may include one or more dams 52 to help prevent the flow of any subsequently applied material from covering the surface of the gel elastomer 50. The dams 52 may extend along one or more sides of the semiconductor die 12, as desired, and may be of any suitable height. The dams 52 may be of any suitable material. Alternatively, the dams 52 may comprise a second layer of gel elastomer 50 having a size smaller than that of the gel elastomer 50. Subsequent glob top application is difficult to precisely control, and any glob top material 38 which lands on the gel elastomer 50 will be later removed by removal of the gel elastomer from the active surface 14 of the semiconductor die 12. Typically, the gel elastomer 50 may be removed simply by peeling it from the active surface 14 of the semiconductor die 12. Typically, if the gel elastomer 50 is to be removed from the semiconductor die 12 after the glob top material application, a silicon type elastomer may be used on the semiconductor die 12 and removed therefrom for the application of a heat sink to the semiconductor die 12.

The gel elastomer 50 is a recently developed material and includes Heat Path™ filled cross-linked silicone gels sold by Raychem. As used in this invention, the gel elastomer 50 is filled with a conductive material to provide high thermal conductivity. The gel elastomer material is compliant under light pressure, has a solid shape retention, cohesive strength and the ability to wet and adhere to surfaces.

Figure 3B:
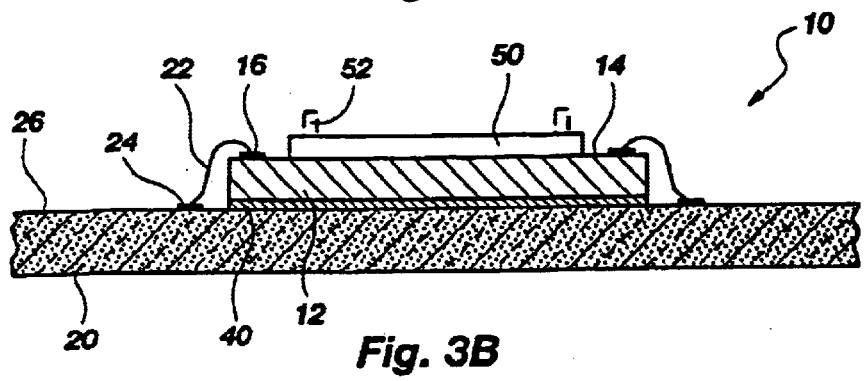

In the next step, shown in drawing FIG. 3B, the bond pads 16 are wire bonded to electrical connection pads 24 on the substrate 20 by, e.g., thermosonic, thermocompression or ultrasonic methods, as known in the art.

Alternatively, the wire bonding step may precede application of the gel elastomer 50.

Figure 3C:
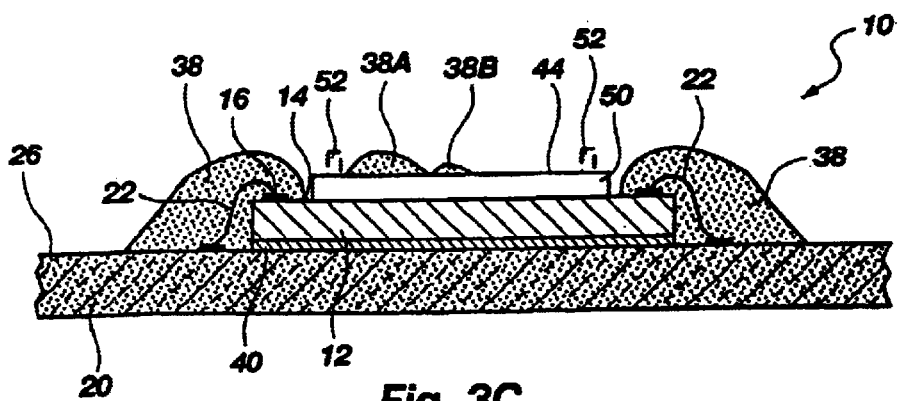

In drawing FIG. 3C, depicted is the next step of the process, that of applying glob top material 38 or suitable potting material to encapsulate the wire connections and the edges 32 (FIG. 3A) of the semiconductor die 12. The glob top material 38 is typically a thermally resistive polymer such as commercially available epoxy or urethane. The glob top material 38 is typically applied as a curable liquid through a small nozzle, not shown, to extend to the layer of gel elastomer 50, or nearly so. As shown, portions 38A and 38B of the glob top material 38 have spilled onto the exposed surface 44 of gel elastomer 50. Without use of the layer of gel elastomer 50, effective removal of glob top portions 38A and 38B may damage the die semiconductor 12 and/or substrate 20 and/or lead wires 22, etc.

Application of the glob top material 38 is followed by a curing step, such as by temperature elevation. The glob top material 38 is cured to provide a hard, impenetrable sealing surface.

Figure 3D:
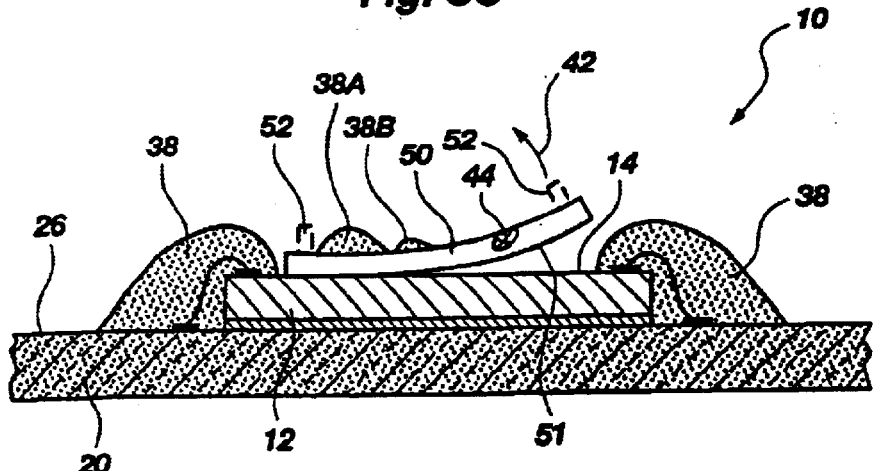
Figure 3E:
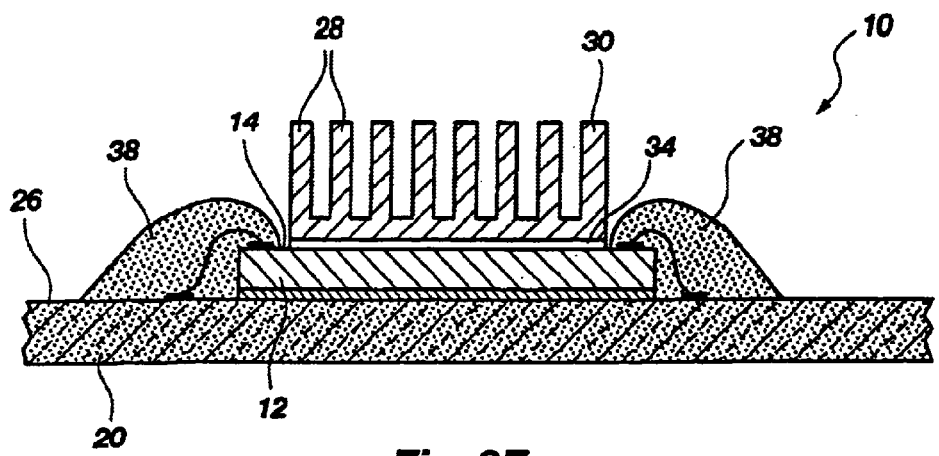

As shown in drawing FIG. 3D, the gel elastomer 50 is then peeled away in direction 42 from the active surface 14 of the semiconductor die 12. It has been found that the lower surface 51 of the gel elastomer 50 may be easily and cleanly stripped from the active surface 14 of semiconductor die 12 by simply peeling away the gel elastomer coupon. This leaves the active surface 14 of the semiconductor die 12 clean and prepared for strong bonding of a heat sink 30 with an adhesive 34, shown in drawing FIG. 3E.

The particular materials which may be used as die-to-substrate adhesives 40 include those commonly known and/or used in the art. Examples of such are polyimides, a 75% silver filled cyanate ester paste, an 80% silver filled cyanate ester paste, a silver filled lead glass paste, etc.

The adhesive 34 used to bond the heat sink 30 to the active surface 14 of the semiconductor die 12 may be an epoxy or the above identified die-to-substrate adhesives or an adhesive as known in the art.

Figure 3F:
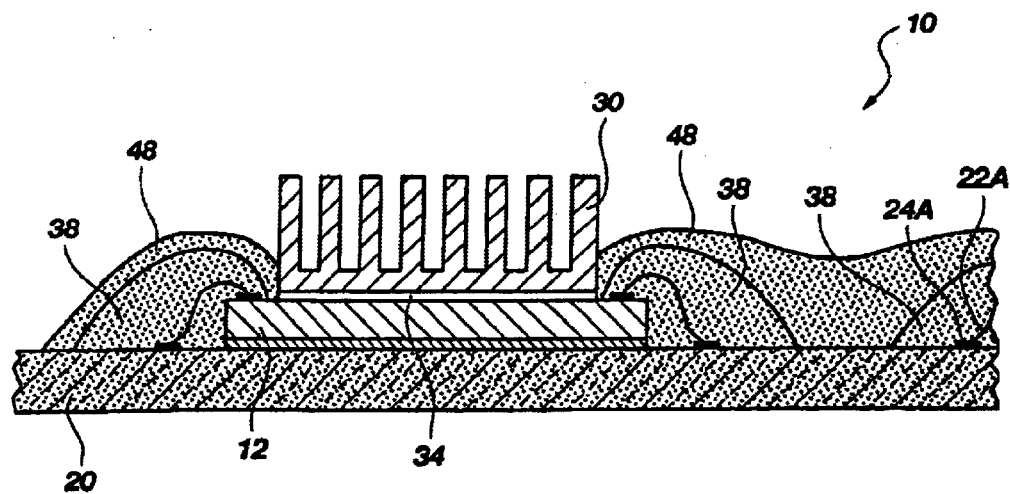

As illustrated in drawing FIG. 3F, further glob top material 48 may be applied to the semiconductor device 10, particularly between the existing glob top material 38 and the heat sink 30, for improved sealing. In this figure, the glob top materials 38 and 48 are shown overcovering the substrate 20 between semiconductor device 10 and an adjacent device, of which only a connection pad 24A and a bond wire 22A are visible. The semiconductor device 10 is effectively sealed to the substrate 20 to prevent electrical short-circuiting, wire breakage and debonding, and moisture penetration.

Figure 3G:
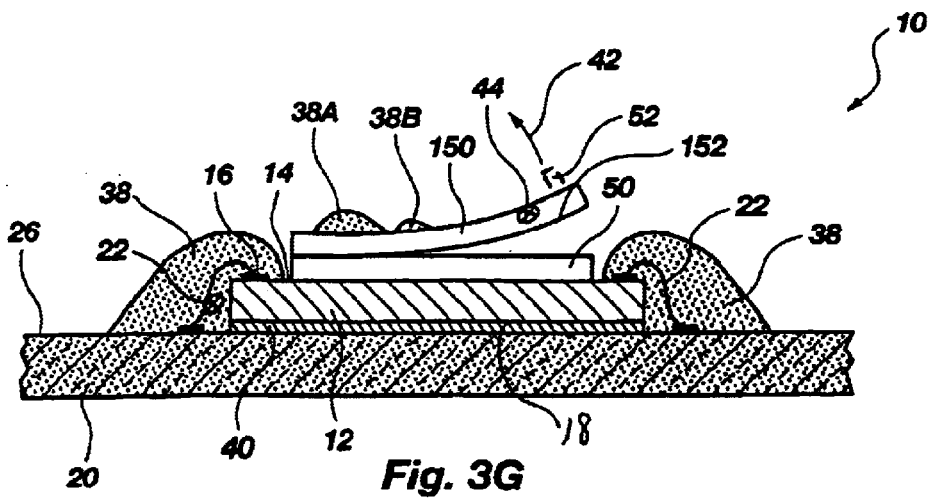

In drawing FIG. 3G, a semiconductor die 12 has an active surface 14 with bond pads 16 near opposing sides of the semiconductor die 12. The back side 18 (FIG. 4A) of the semiconductor die 12 is first bonded to the upper surface 26 of the substrate 20 by a layer of adhesive 40. The substrate 20 may be a printed circuit board (PCB) or other materials such as a flex circuit or ceramic. A layer of a thermally conductive filled gel elastomer 50 is either permanently applied to the semiconductor die while in wafer form or subsequently applied to active surface 14 between the arrays of bond pads 16 of the semiconductor die 12 after singulation of the semiconductor die 12 from the wafer. A layer or piece of disposable elastomer or tape 150 is releasably applied over the gel elastomer 50. The purpose of the elastomer or tape 150 is to provide a protective mask over an area of the gel elastomer 50 attached to the semiconductor die 12 to which the heat sink 30 is to be bonded. The elastomer 150 is applied as a semi-solid or solid coupon. The elastomer 150 is to be disposed after removal from the semiconductor die 12 and may include one or more dams 52 to help prevent the flow of any subsequently applied material from covering the surface of the elastomer 150. The dams 52 may extend along one or more sides of the elastomer 150, as desired, and may be of any suitable height. The dams 52 may be of any suitable material. Alternatively, the dams 52 may comprise a second layer of elastomer 150 having a size smaller than that of the gel elastomer 50. Subsequent glob top application is difficult to precisely control, and any glob top material 38 which lands on the elastomer 50 will be later removed by removal of the elastomer 150 from the surface of the gel elastomer 50. Typically, the elastomer 150 may be removed simply by peeling it from the surface of the gel elastomer 50 permanently attached to the semiconductor die 12. Typically, if the elastomer 150 is to be removed from the gel elastomer 50 after the glob top material application, a silicon type elastomer may be used on the semiconductor die 12 and removed therefrom for the application of a heat sink to the semiconductor die 12.

As shown in drawing FIG. 3G, the layer of elastomer 150 is then peeled away in direction 42 from the surface of the gel elastomer 50. It has been found that the lower surface 152 of the elastomer 150 may be easily and cleanly stripped from the surface of the gel elastomer 50 by simply peeling away the elastomer coupon. This leaves the surface of the gel elastomer 50 clean and prepared for strong bonding of a heat sink 30 with an adhesive 34, shown in drawing FIG. 3E.

The glob top materials 38 and 48 may be the same or different materials. Glob top materials useful for this application include HYSOL™ FP4451 material or HYSOL™ FP4450 high purity, low stress liquid encapsulant material, available from the DEXTER ELECTRONIC MATERIALS DIVISION OF DEXTER CORPORATION, etc.

Figure 2:
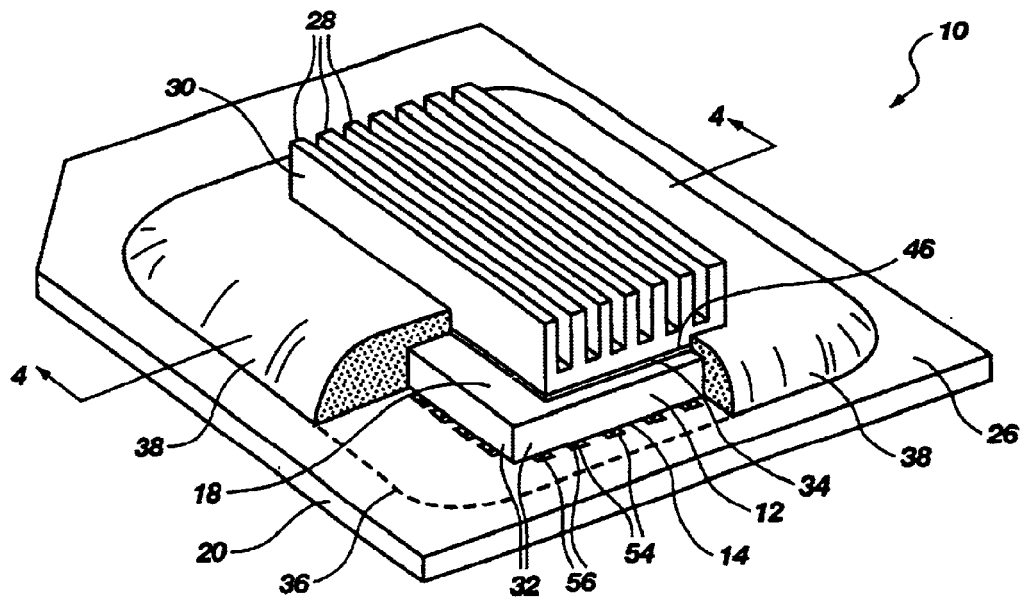
FIG. 2 is a perspective view of a flip-chip Chip On Board (COB) semiconductor device of the invention.

Depicted in drawing FIG. 2 is another aspect of the invention, wherein the semiconductor die 12 is bonded flip-chip fashion to electrical circuit traces 54 on the upper surface 26 of substrate 20. The semiconductor die 12 has an active surface 14 with a grid of electrical connections 56 attached to the corresponding circuit traces 54. The electrical connections 56 may comprise a ball grid array (BGA) of solder balls, as shown, or other array. The opposite, back side 18 of the semiconductor die 12 is directed upwardly, away from the substrate 20. A heat sink 30, here shown with fins 28, has an attachment surface 46 which is adhesively bonded to the back side 18 with adhesive 34. Glob top material 38 is applied to seal the semiconductor die 12, including its edges 32, and a surrounding portion 36 of the substrate. A major portion of the heat sink 30 is exposed to the ambient air for high heat transfer rates. Where very high heat dissipation rates are required, a fan (not shown) may be used to provide a high rate of air movement past the heat sink 30. This type of attachment may similarly be used in chip scale packages, if desired. In such an instance, the semiconductor die 12 would be replaced by a chip scale package bonded flip-chip fashion to electrical circuit traces 54 on the upper surface 26 of substrate 20. The chip scale package has an active surface 14 with a grid of electrical connections 56 attached to the corresponding circuit traces 54. The electrical connections 56 may comprise a ball grid array (BGA) of solder balls, as shown, or other array. The opposite, back side 18 of the chip scale package is directed upwardly, away from the substrate 20. A heat sink 30, here shown with fins 28, has an attachment surface 46 which is adhesively bonded to the back side 18 of the chip scale package with adhesive 34. Glob top material 38 is applied to seal the chip scale package, including its edges 32, and a surrounding portion 36 of the substrate. A major portion of the heat sink 30 is exposed to the ambient air for high heat transfer rates. Where very high heat dissipation rates are required, a fan (not shown) may be used to provide a high rate of air movement past the heat sink 30.

The steps of fabricating the semiconductor device 10 of drawing FIG. 2 are illustrated in drawing FIGS. 4A through 4F. If a chip scale package is used rather than a semiconductor die 12, all numerals and descriptions of the invention are the same except that the semiconductor die 12 is a chip scale package.

Figure 4A:
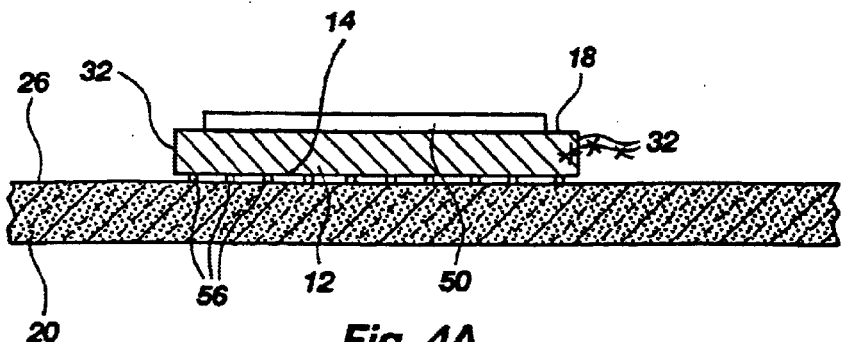
FIGS. 4A through 4F are cross-sectional views of a flip-chip Chip On Board (COB) semiconductor device illustrating the steps of fabrication in accordance with the invention, as taken along line 4—4 of FIG. 2.

As depicted in drawing FIG. 4A, a flip-chip or semiconductor die 12 having an active surface 14 with a grid of electrical connections 56, shown as solder balls, is down bonded to electrical circuit traces 54 (not shown) on an upper surface 26 of a substrate 20. The semiconductor die 12 has an opposing back side 18 and edges 32. The substrate 20 may be a printed circuit board (PCB) or other material such as a flex circuit or ceramic. A layer or coupon of thermally conductive filled gel elastomer 50, alternatively, a suitable elastomer, silicon elastomeric material, etc. if the gel elastomer 50 is to be discarded, is applied as a solid or semisolid to the back side 18 of the semiconductor die 12, either before or (preferably) after the semiconductor die 12 is electrically down bonded to the substrate 20. The gel elastomer 50 masks the back side 18 from glob top material 38 which may be inadvertently misapplied to the back side 18, requiring removal by erosive blasting or other methods. The use of the gel elastomer 50 obviates such glob top removal methods.

Figure 4B:
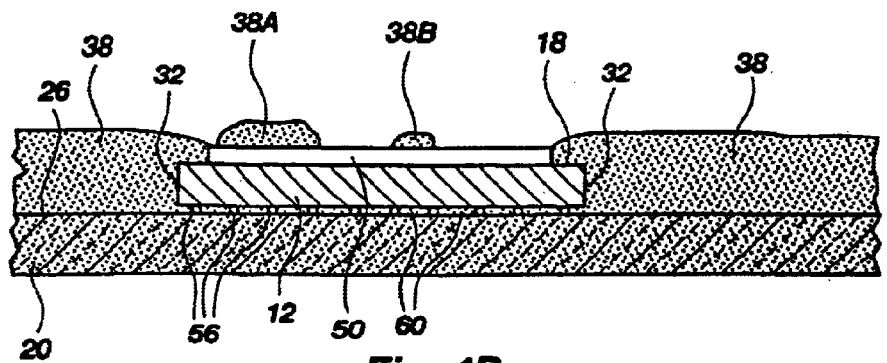

As shown in drawing FIG. 4B, the next step encompasses the application of glob top material 38 to encapsulate and seal the semiconductor die 12 and portions of the adjacent substrate upper surface 26. Preferably, the spaces 60 between the solder balls 56 are first filled with glob top material 38 or another low viscosity polymeric material. In these figures, the glob top material 38 is depicted as applied to form a nearly uniform depth over an extended substrate area. Some of the glob top material 38 is shown as having been misapplied to the layer of gel elastomer 50 as portions 38A and 38B.

The glob top material 38 is then cured, for example, by heating.

Figure 4C:
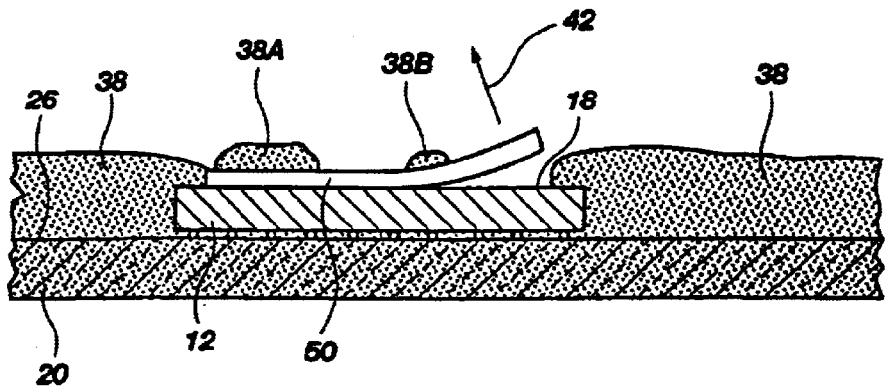
Figure 4D:
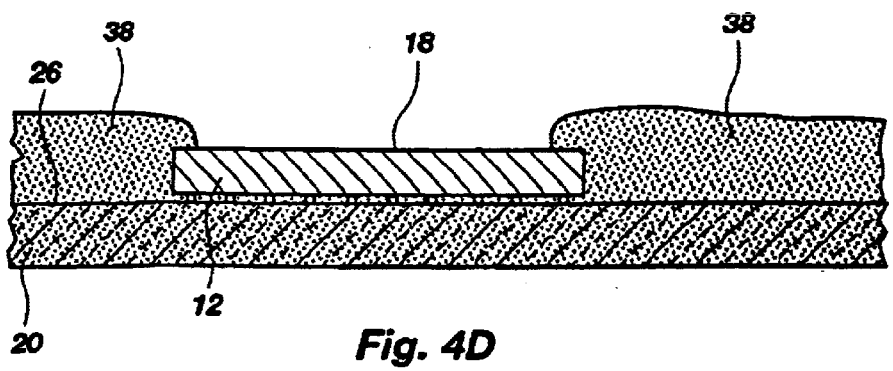

As shown in drawing FIG. 4C, the gel elastomer 50 is then removed, e.g., by peeling it from the back side 18 of the semiconductor die 12. The back side 18 of semiconductor die 12 in drawing FIG. 4D is then bare and clean for enhanced attachment of a heat sink 30 thereto.

Figure 4E:
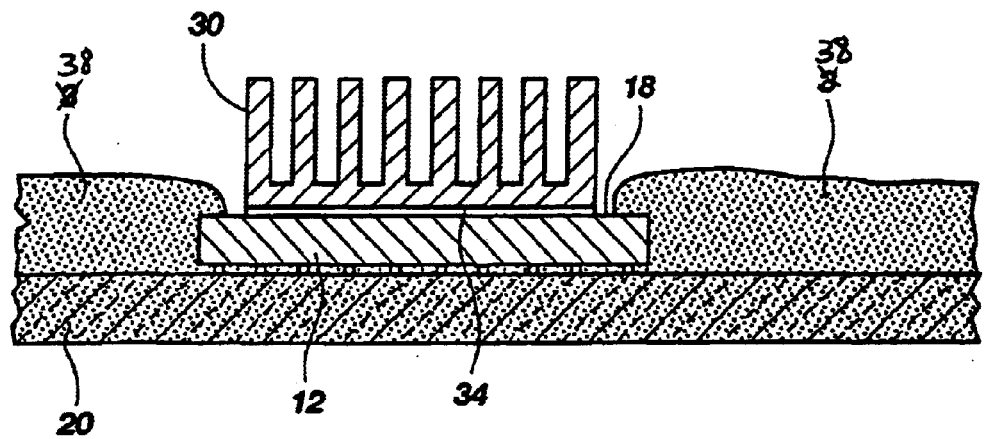

In drawing FIG. 4E, a heat sink 30 is bonded to the back side 18 of semiconductor die 12 by a layer of adhesive 34, as already described, relative to the embodiment of drawing FIG. 1.

Figure 4F:
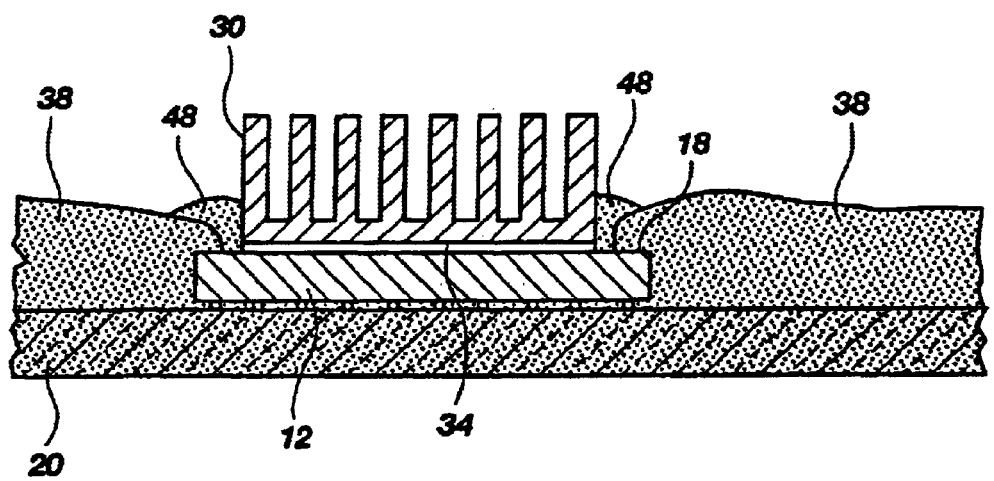

In drawing FIG. 4F, a further application of a glob top material 48 may be performed, particularly to fill the spaces between the glob top material 38 and the heat sink 30. The glob top material 48 may be the same as glob top material 38, or may be different.

Alternatively, a room temperature vulcanizing rubber (RTV), which may vary in the degree of thermal conductivity thereof, may be used to completely cover and seal the device to the substrate 20, including the glob top material 38.

Although a major portion of the heat sink 30 is unencapsulated in the preferred embodiment, the heat sink may also be completely or nearly completely encapsulated.

The Chip On Board semiconductor device 10 of drawing FIG. 1 or drawing FIG. 2 may be formed as merely one of a plurality of components attached and sealed to a substrate. Alternatively, the chip scale package (CSP) semiconductor device 10, shown in FIG. 6, may be a stand-alone encapsulated device whereby a grid of electrical connections is formed on the opposite side 58 (see FIG. 6) of the substrate 20 for bonding to another substrate, not shown.

While application of the gel elastomer 50 to the semiconductor die 12, when singulated or while in wafer form, is an additional step in device fabrication, it eliminates the troublesome step of glob top removal required by misapplication of glob top material to the die surface. A clean surface for bonding to a heat sink is assured. In addition, no other layers of good conductors and/or poor conductors are required, enabling both (a) high heat removal and (b) a device of reduced dimensions.

The gel elastomer 50 may also be used as a permanent compliant member 70 between a semiconductor die 12 and a heat sink 30. As depicted in drawing FIG. 5, a semiconductor die 12 has an active surface 14 with a ball grid array (BGA) of electrical connections 56 connected to traces (not shown) on a circuit board or other substrate 20. A layer 70 of gel elastomer is then applied to inside attachment surface 46 of a cap style heat sink 30. The heat sink 30 may be finned, or have no fins 28. In one embodiment, the heat sink 30 has lateral walls 62 whose lower edges 64 are designed to abut the upper surface 26 of the substrate 20. Alternatively (FIG. 6), a portion of the substrate 20 is configured to fit within the open end 66 of the heat sink 30.

Figure 7:
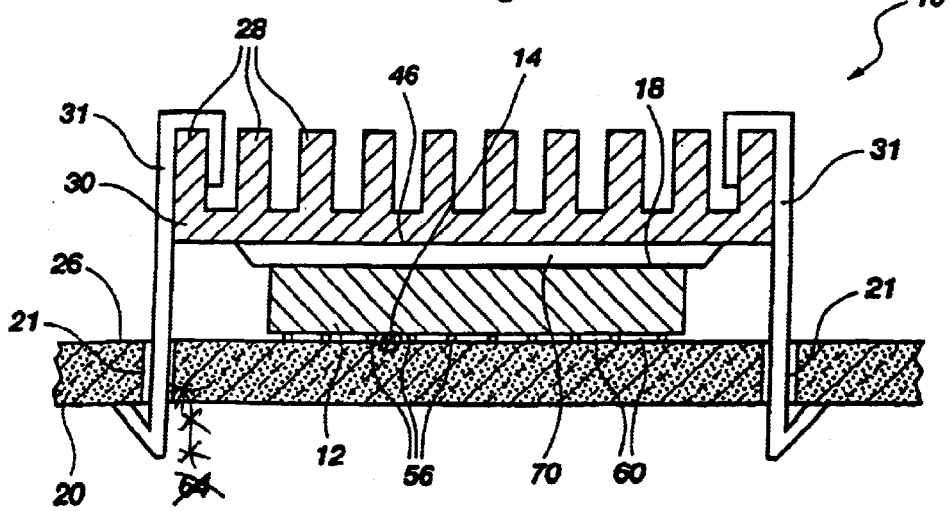
FIG. 7 is a cross-sectional view of a circuit board mounted semiconductor device of the invention having a heat sink resiliently retained on the semiconductor die.

As depicted in drawing FIG. 7, a semiconductor die 12 has an active surface 14 with a ball grid array (BGA) of electrical connections 56 connected to traces (not shown) on a circuit board or other substrate 20 having a plurality of apertures 21 therein. A layer 70 of gel elastomer is then applied to inside attachment surface 46 of a cap style heat sink 30. The heat sink 30 may be finned, or have no fins 28. In one embodiment, the heat sink 30 has resilient spring members 31 having a portion thereof engaging a fin 28 while the other end thereof engages an aperture 21 of the substrate 20 to resiliently retain the heat sink 30 engaging the gel elastomer layer 70 which engages the back side 18 of the semiconductor die 12, leaving the heat sink 30 and semiconductor die 12 free to move with respect to each other.

Figure 5:
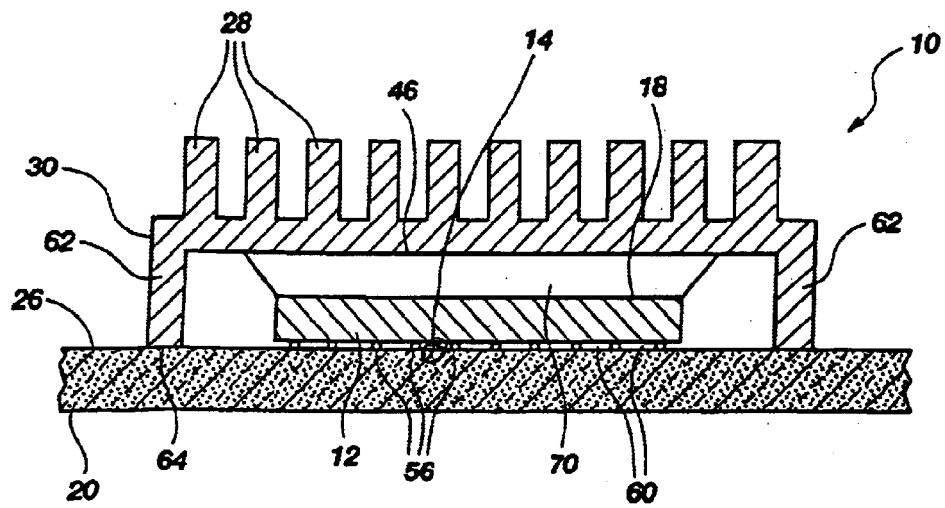
FIG. 5 is a cross-sectional view of a Chip On Board (COB) semiconductor device of the invention having a cap as a heat sink.
Figure 6:
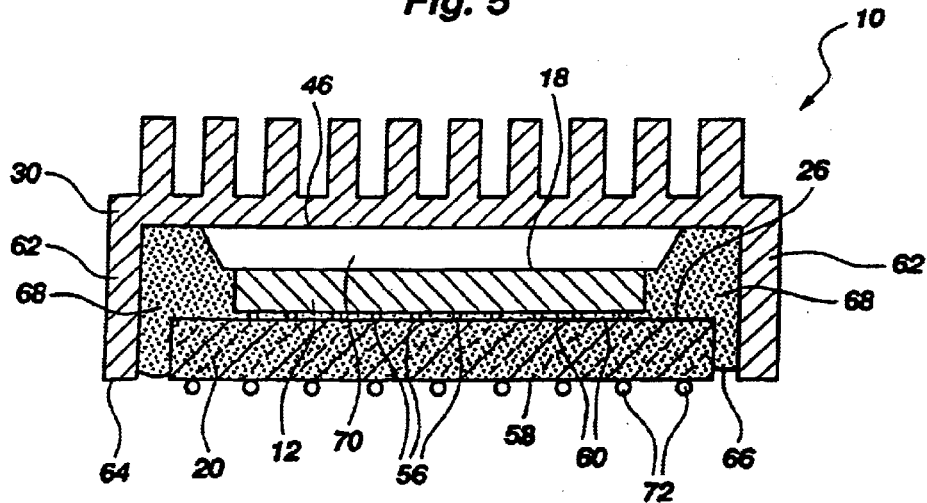
FIG. 6 is a cross-sectional view of a circuit board mounted semiconductor device of the invention having a cap as a heat sink.

In either case, as illustrated in drawing FIGS. 5, 6, and 7, the back side 18 of semiconductor die 12 is then pressed into the gel elastomer layer 70 for attachment thereto. The adhesion of the gel elastomer layer 70 to the attachment surface 46 of the heat sink 30 and the back side 18 of the semiconductor die 12 as well as the resilient spring members 31 holds the parts in place.

As a further step, the interior of the heat sink "cap" may be filled with encapsulant material 68 as shown in FIG. 6. In the embodiment of drawing FIG. 5, encapsulant may be injected through holes (not shown) in the heat sink 30.

The embodiment of drawing FIG. 6 is shown with a further ball grid array (BGA) of solder balls 72 on the opposite side 58 of the substrate. Thus, the semiconductor device 10 may be bonded to another substrate, such as a circuit board, not shown.

In an alternative method of forming the semiconductor devices of drawing FIGS. 5 and 6, the gel elastomer layer 70 is first applied to back side 18 of the semiconductor die 12, which is then pressed into the attachment surface 46 of the heat sink 30.

In the embodiments of drawing FIGS. 5 and 6, overpressuring of the die/substrate interface is eliminated by the compliance of the filled gel elastomer. Simultaneously, the high thermal conductivity of the filled gel elastomer maintains high heat dissipation from the device.

It is apparent to those skilled in the art that various changes and modifications may be made to the method and apparatus of the invention as disclosed herein without departing from the spirit and scope of the invention as defined in the following claims.

What is claimed is:

1. A semiconductor assembly comprising:

a substrate having a surface;

a semiconductor die having a plurality of edges, having an active surface having a plurality of bond pads thereon located adjacent at least two edges of the plurality of edges, and having a back side surface, the semiconductor die having at least a portion of the back side surface adhesively attached to at least a portion of the surface of the substrate;

a gel elastomer contacting at least a portion of the active surface of the semiconductor die;

a layer of adhesive substantially covering a surface of the gel elastomer;

a heat sink attached to the gel elastomer by the layer of adhesive; and an encapsulation material covering a portion of the surface of the substrate, the plurality of edges of the semiconductor die, and at least one bond pad of the plurality of bond pads located adjacent at least two edges of the semiconductor die, wherein the encapsulation material excludes covering the heat sink.

2. The semiconductor assembly of claim 1, wherein the heat sink includes a plurality of fins thereon.

3. A semiconductor assembly comprising:

a substrate having a plurality of electrical connections on a portion of a surface thereof;

at least one semiconductor die having a plurality of bond pads on a first portion of an active surface thereof and having a back side surface, a portion of the back side surface adhesively attached to a portion of the surface of the substrate;

a plurality of wire bonds connecting at least a portion of the plurality of bond pads of the at least one semiconductor die to at least a portion of the plurality of electrical connections of the substrate, a gel elastomer contacting a second portion of the active surface of the at least one semiconductor die;

a layer of adhesive substantially covering a surface of the gel elastomer;

a heat sink attached to the gel elastomer by the layer of adhesive; and an encapsulant material covering a portion of the surface of the substrate, the plurality of bond pads on the active surface of the at least one semiconductor die, a portion of the active surface of the at least one semiconductor die, and the plurality of wire bonds, wherein the encapsulation material excludes covering the heat sink.

4. The semiconductor assembly of claim 3, wherein the heat sink includes a plurality of fins thereon.

* * * * *

UNITED STATES PATENT AND TRADEMARK OFFICE
CERTIFICATE OF CORRECTION

| | |
|---|---|
| PATENT NO. | : 6,806,567 B2 |
| APPLICATION NO. | : 09/834297 |
| DATED | : October 19, 2004 |
| INVENTOR(S) | : David R. Hembree |

It is certified that error appears in the above-identified patent and that said Letters Patent is hereby corrected as shown below:

In the drawings:

| | |
|---|---|
| FIGURE 3A, | delete the lower lead line of "32" (right-most occurrence) (already crossed out) |
| FIGURE 3D, | shorten the lead line of "44" to better indicate the exposed surface (excess already crossed out) |
| FIGURE 3G, | shorten the lead line of "44" to better indicate the exposed surface (excess already crossed out), shorten the lead line of "22" to better indicate the wire (excess already crossed out), and add the reference numeral --18-- with appropriate lead line (already handwritten in) |
| FIGURE 4A, | delete the lower lead line of "32" (right-most occurrence) (already crossed out) |
| FIGURE 4E, | change "3" to --38-- (both occurrences) (already crossed out and handwritten in) |
| FIGURE 5, | shorten the lead line of "14" to better indicate the active surface (excess already crossed out) |

UNITED STATES PATENT AND TRADEMARK OFFICE
CERTIFICATE OF CORRECTION

PATENT NO. : 6,806,567 B2
APPLICATION NO. : 09/834297
DATED : October 19, 2004
INVENTOR(S) : David R. Hembree It is certified that error appears in the above-identified patent and that said Letters Patent is hereby corrected as shown below:

In the drawings (continued):
    FIGURE 7,                     shorten the lead line of "14" to better indicate the active surface (excess already crossed out), and delete reference numeral "64" with corresponding lead line (already crossed out)

In the specification:
    COLUMN 6,   LINE 38,     change "elastomer 50" to --elastomer 150--

Signed and Sealed this

Tenth Day of June, 2008

JON W. DUDAS
*Director of the United States Patent and Trademark Office*

UNITED STATES PATENT AND TRADEMARK OFFICE
CERTIFICATE OF CORRECTION

PATENT NO.        : 6,806,567 B2
APPLICATION NO. : 09/834297
DATED             : October 19, 2004
INVENTOR(S)       : David R. Hembree Page 3 of 9

It is certified that error appears in the above-identified patent and that said Letters Patent is hereby corrected as shown below:

Replace FIG. 3A with the following:

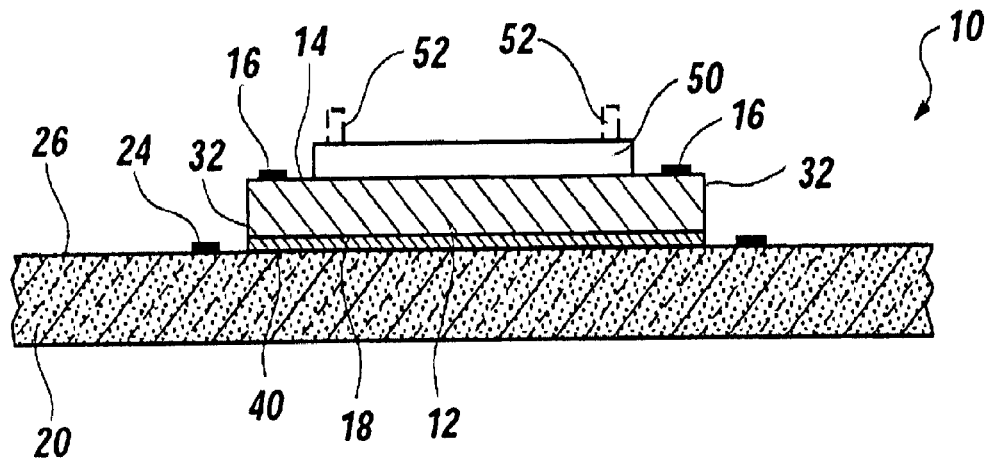

Fig. 3A

UNITED STATES PATENT AND TRADEMARK OFFICE
CERTIFICATE OF CORRECTION

| | |
|---|---|
| PATENT NO. | : 6,806,567 B2 |
| APPLICATION NO. | : 09/834297 |
| DATED | : October 19, 2004 |
| INVENTOR(S) | : David R. Hembree |

Page 4 of 9

It is certified that error appears in the above-identified patent and that said Letters Patent is hereby corrected as shown below:

Replace FIG. 3D with the following:

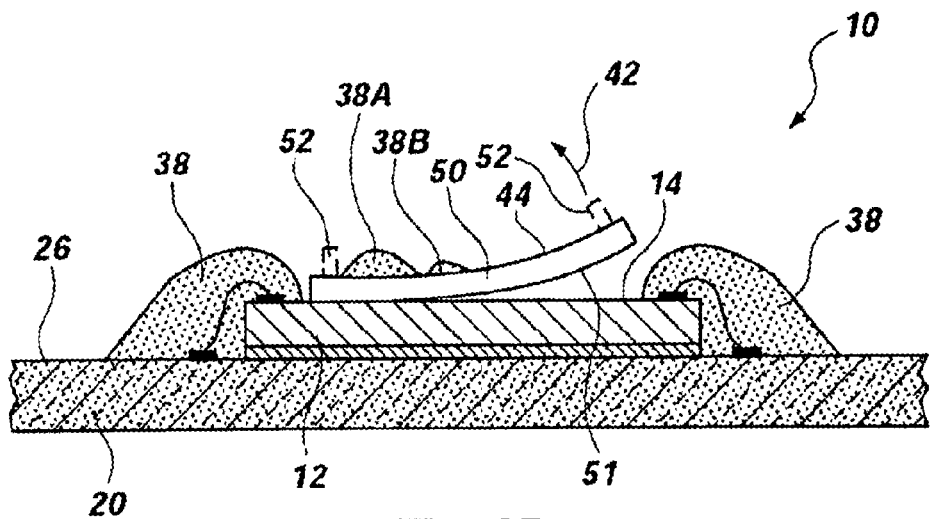

Fig. 3D

UNITED STATES PATENT AND TRADEMARK OFFICE
CERTIFICATE OF CORRECTION

PATENT NO.       : 6,806,567 B2                                Page 5 of 9
APPLICATION NO.  : 09/834297
DATED            : October 19, 2004
INVENTOR(S)      : David R. Hembree It is certified that error appears in the above-identified patent and that said Letters Patent is hereby corrected as shown below:

Replace FIG. 3G with the following:

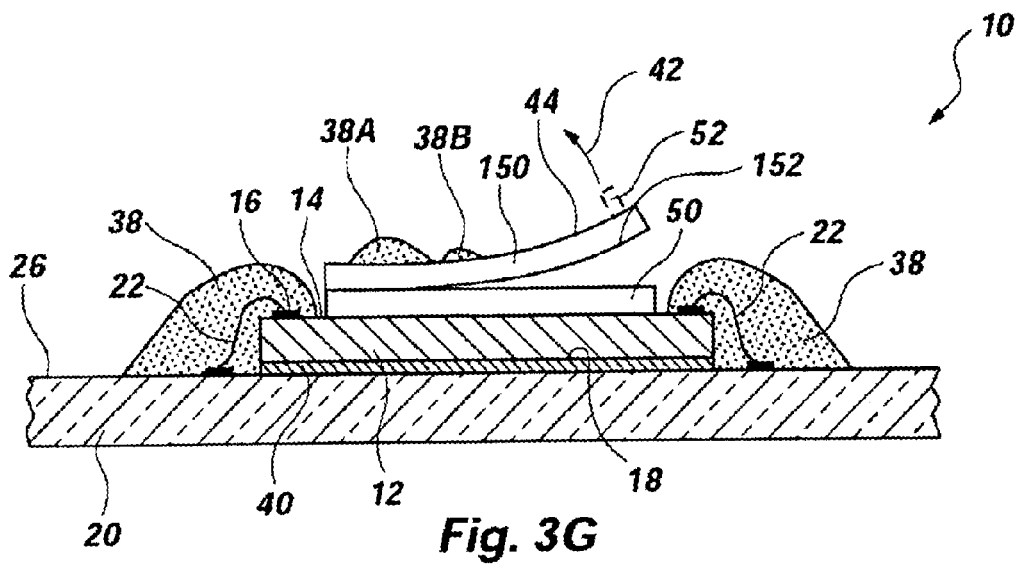

Fig. 3G

UNITED STATES PATENT AND TRADEMARK OFFICE
CERTIFICATE OF CORRECTION

| | | |
|---|---|---|
| PATENT NO. | : 6,806,567 B2 | |
| APPLICATION NO. | : 09/834297 | |
| DATED | : October 19, 2004 | |
| INVENTOR(S) | : David R. Hembree | |

It is certified that error appears in the above-identified patent and that said Letters Patent is hereby corrected as shown below:

Replace FIG. 4A with the following:

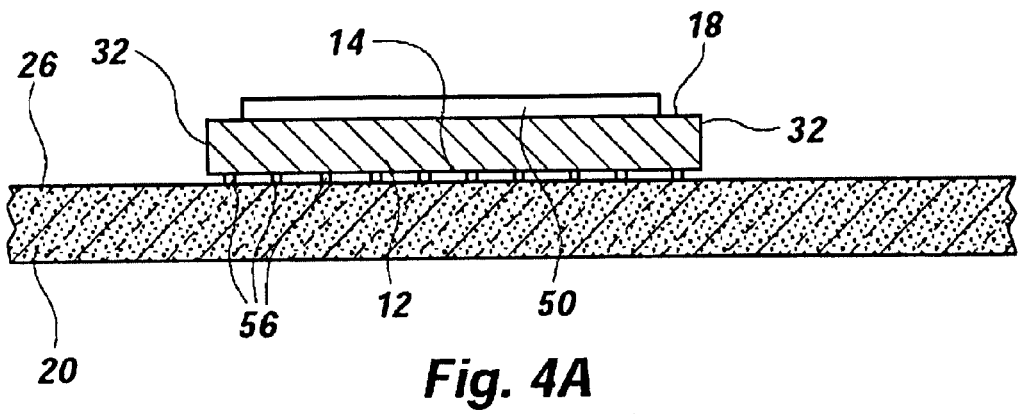

Fig. 4A

UNITED STATES PATENT AND TRADEMARK OFFICE
CERTIFICATE OF CORRECTION

PATENT NO.        : 6,806,567 B2
APPLICATION NO. : 09/834297
DATED             : October 19, 2004
INVENTOR(S)      : David R. Hembree It is certified that error appears in the above-identified patent and that said Letters Patent is hereby corrected as shown below:

Replace FIG. 4E with the following:

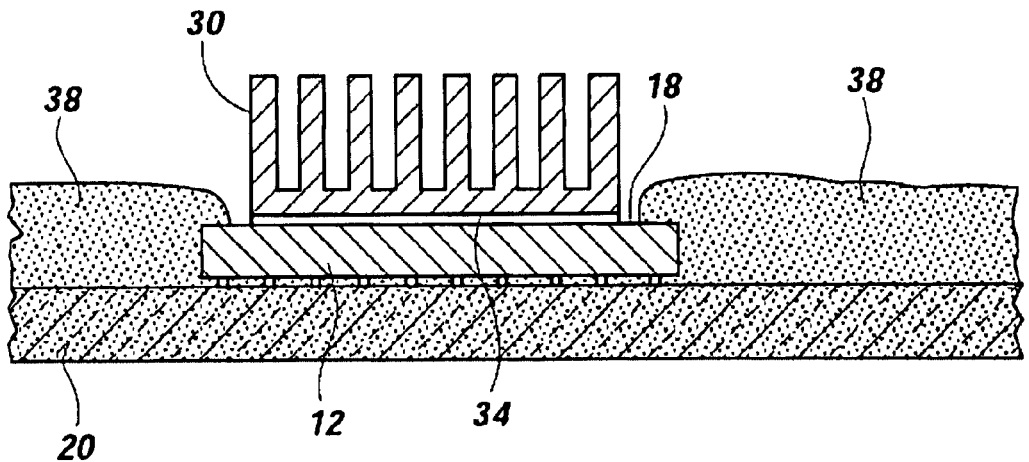

Fig. 4E

UNITED STATES PATENT AND TRADEMARK OFFICE
CERTIFICATE OF CORRECTION

PATENT NO. : 6,806,567 B2
APPLICATION NO. : 09/834297
DATED : October 19, 2004
INVENTOR(S) : David R. Hembree It is certified that error appears in the above-identified patent and that said Letters Patent is hereby corrected as shown below:

Replace FIG. 5 with the following:

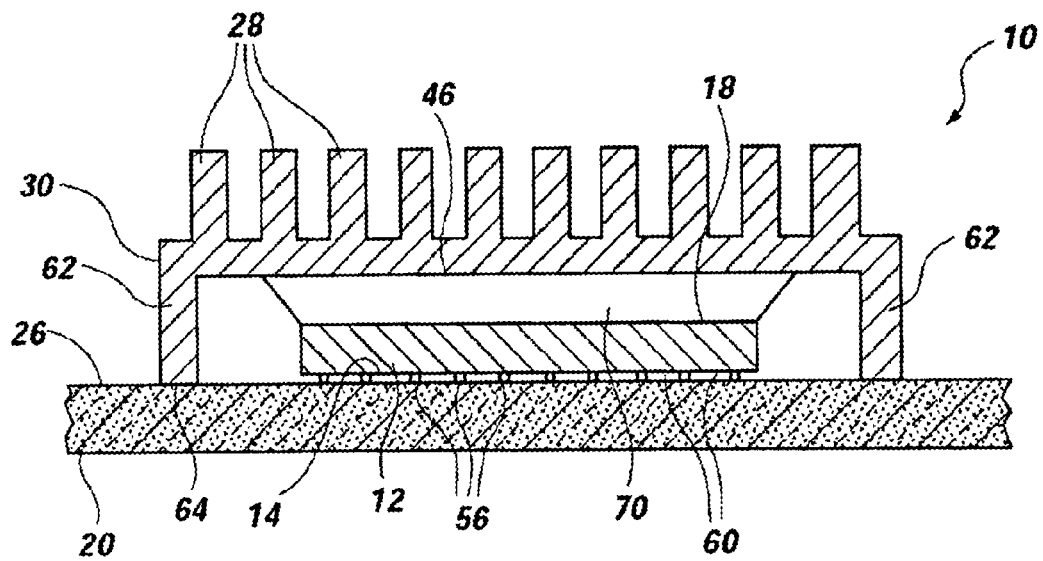

Fig. 5

UNITED STATES PATENT AND TRADEMARK OFFICE
CERTIFICATE OF CORRECTION

PATENT NO. : 6,806,567 B2
APPLICATION NO. : 09/834297
DATED : October 19, 2004
INVENTOR(S) : David R. Hembree It is certified that error appears in the above-identified patent and that said Letters Patent is hereby corrected as shown below:

Replace FIG. 7 with the following:

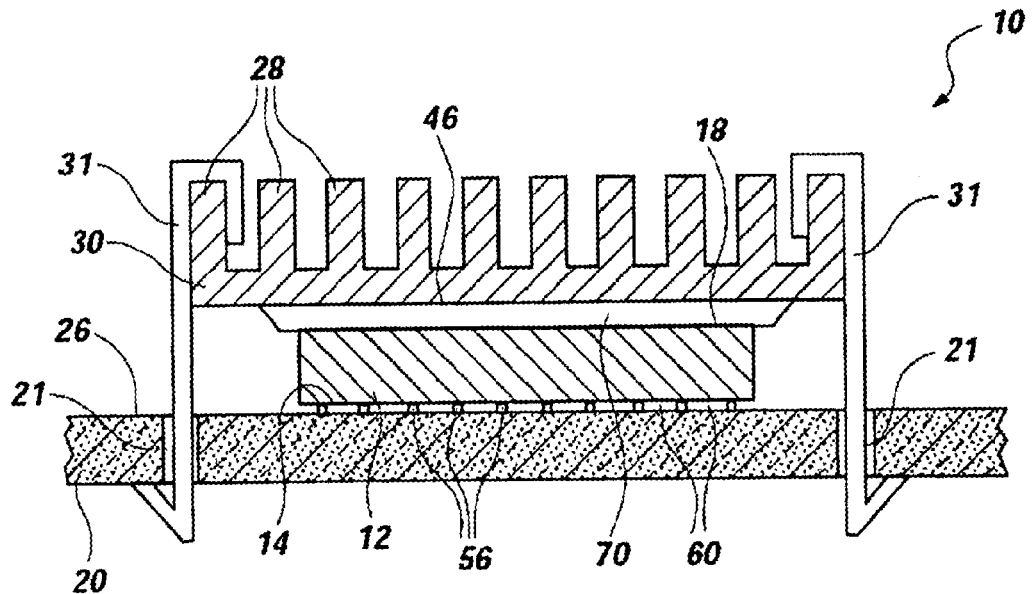

Fig. 7